United States Patent
Houng et al.

(10) Patent No.: US 7,135,394 B2
(45) Date of Patent: Nov. 14, 2006

(54) CONDUCTIVE LAYERS AND FABRICATION METHODS THEREOF

(75) Inventors: Ying-Chang Houng, Guansi Township, Hsinchu County (TW); Hong-Ching Lin, Kaohsiung (TW); Chi-Jen Shih, Fongshan (TW); Shao-Ju Shih, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 112 days.

(21) Appl. No.: 11/002,509

(22) Filed: Dec. 2, 2004

(65) Prior Publication Data
US 2005/0142839 A1    Jun. 30, 2005

(30) Foreign Application Priority Data
Dec. 31, 2003    (TW) ............... 92137729 A

(51) Int. Cl.
*H01L 21/44*    (2006.01)
(52) U.S. Cl. ............ 438/610; 438/584

(58) Field of Classification Search ........... 438/584, 438/590, 592, 610, 614
See application file for complete search history.

(56) References Cited

U.S. PATENT DOCUMENTS

| | | | |
|---|---|---|---|
| 6,036,889 A | 3/2000 | Kydd | 430/281.1 |
| 2004/0076562 A1* | 4/2004 | Manzanec et al. | 422/211 |

FOREIGN PATENT DOCUMENTS

WO    WO 99/43728    9/1999

* cited by examiner

*Primary Examiner*—Phuc T. Dang
(74) *Attorney, Agent, or Firm*—Thomas, Kayden, Horstemeyer & Risley

(57) ABSTRACT

Methods for forming conductive layers. A layer of metal composite is applied on a substrate, comprising a plurality of metal flakes, a plurality of nanometer metal spheres, and a plurality of mixed metal precursors. The plurality of mixed metal precursors comprises a mixture of inorganic salts and organic acidic salts. The layer of metal composite is cured to induce an exothermic reaction, thereby forming a conductive layer on the substrate at a relatively low temperature (<200° C.)

5 Claims, 2 Drawing Sheets

CONDUCTIVE LAYERS AND FABRICATION METHODS THEREOF

BACKGROUND

The invention relates to conductive layers and fabrication methods thereof and, more particularly, to methods for fabricating high conductive layers at a relatively low curing temperature.

Typically, the thermal resist temperature or operative temperature for fabricating a conductive layer on substrates of conventional electronic products is less than 350° C. for polyimide substrates, 290° C. for printed circuit boards (PCBs), and lower than 200° C. for other plastic substrates. The curing temperature of conductive pastes for conventional low temperature products are constrained to the thermal resist temperature or operative temperature of the substrates. The resistivity of the conductive layer such as silver on the substrate is 10–50 times that of pure silver, resulting in more power consumption, signal loss, and reduction of transmission distance during signal transmission.

U.S. Pat. No. 6,036,889 (Kydd et. al.), the entirety of which is hereby incorporated by reference, discloses a method of fabricating a metal layer. A conductive paste comprising organic acidic salt and metal flakes is formed on a substrate. The organic acidic salts such as silver 2-ethylhexanoate ($C_8H_{15}O_2Ag$) are decomposed at 250–350° C. to create interlinks between the metal flakes, thereby improving conductivity of the metal layer. Moreover, U.S. Pat. No. 6,036,889 (Kydd et. al.), the entirety of which is hereby incorporated by reference, further discloses a method of fabricating a metal layer. Organic acidic salts such as silver 2-ethylhexanoate ($C_8H_{15}O_2Ag$) are decomposed at 250–350° C. to create interlinks between nanometer colloidal metal flakes, thereby improving conductivity of the metal layer.

The decomposition temperature of conventional organic acidic salts, however, is still relatively high, and cannot be held under 200° C. for use in fabrication of conductive layers on plastic substrates.

SUMMARY

Conductive layers and fabrication methods thereof employing relatively low curing temperature are provided. An exemplary embodiment of a conductive layer comprises metal flakes and nanometric metal spheres forming densified compact structure. The conductive layer further comprises inorganic salts and organic acidic salts. Decomposition of the inorganic salts can be exothermic at low temperature to induce another high exothermic reaction of the organic acidic salts, thereby forming continuous conductive layer skeletal network structure, at a temperature of less than 200° C. The resistivity of the conductive layer can achieve less than 7 μΩcm.

Some embodiments of the invention provide a method for forming a conductive layer on a substrate comprising applying a layer of metal composite on the substrate. The metal composite comprises a plurality of metal flakes, a plurality of nanometer metal spheres, and a plurality of mixed metal precursors. The layer of metal composite is cured to induce an exothermic reaction, thereby forming a conductive layer on the substrate at a relatively low temperature.

An exemplary embodiment of a conductive layer structure comprises a main layer formed on a substrate. The main layer comprises a mixture of a plurality of different aspect ratios of metal flakes and a plurality of different diameters of metal spheres. A continuous network skeleton is interposed within the main layer. The continuous network skeleton comprises a plurality of inorganic salts and a plurality of metal precursors.

DESCRIPTION OF THE DRAWINGS

Conductive layers and fabrication methods thereof will be better understood reference to the descriptions to be read in conjunction with the accompanying drawings, in which.

DETAILED DESCRIPTION

As the metal paste becomes thinner and thinner, the continuity of the metal powders must be good enough to ensure lower conductivity of the metal layer. Since the sintering temperature of the metal paste layer, such as silver, is higher than 450° C., low temperature sintered metal layer cannot reach high densification whiling maintaining high conductivity.

Figure 1:
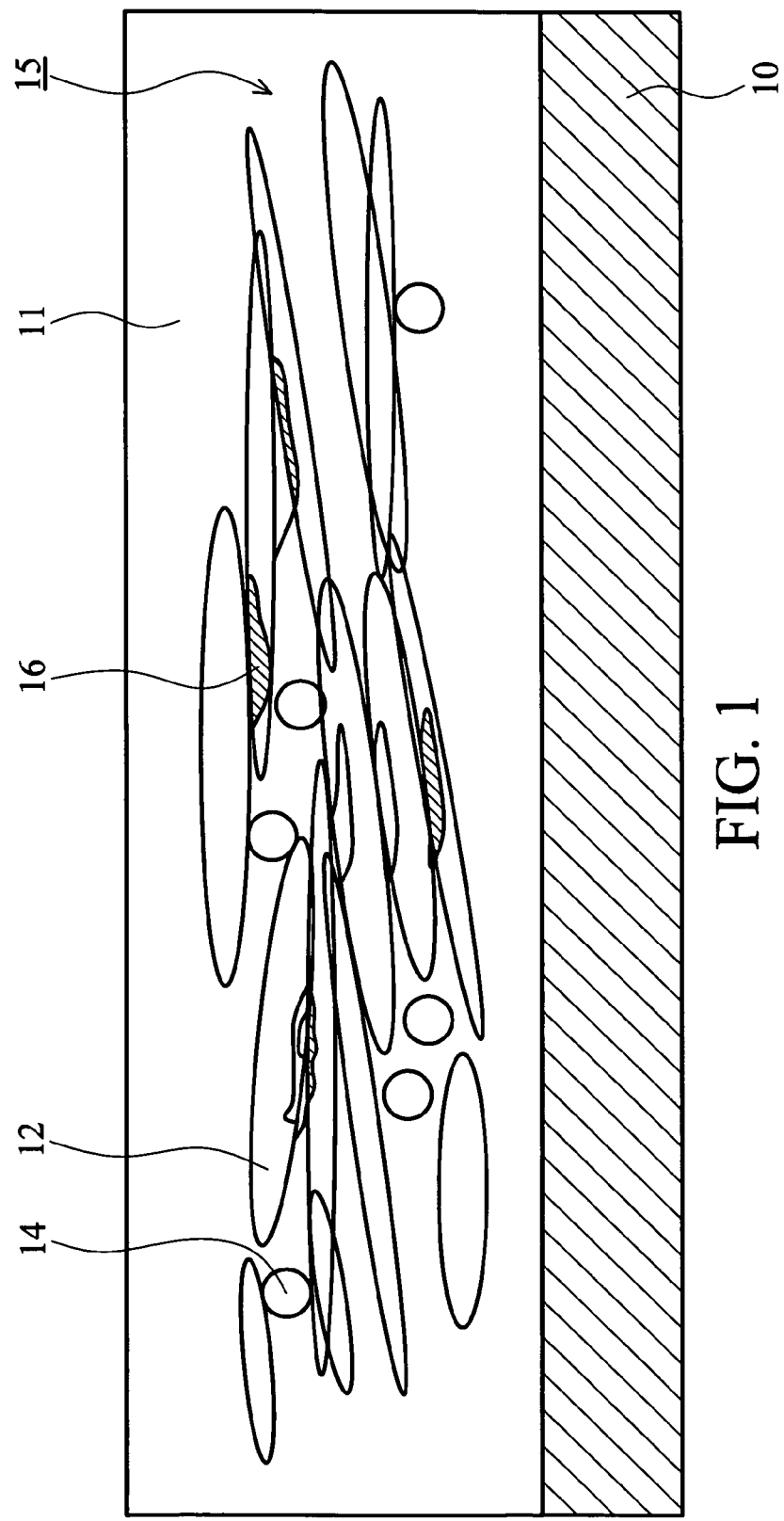
FIG. 1 is a schematic cross-section of an embodiment of a conductive layer on a substrate.

Referring to FIG. 1, a layer of metal paste 15 is provided on a substrate 10. The metal paste layer 15 comprises a main layer comprising a mixture of a plurality of different aspect ratios of metal flakes 12 such as in a range of approximately larger than 1 and less than 20 and a plurality of different diameters of metal spheres 14. A continuous network skeleton is interposed within the main layer. The network skeleton matrix comprises a plurality of inorganic salts and a plurality of metal precursors 16.

The plurality of metal precursors 16 comprises a mixture of organic acidic salts, such as silver 2-ethylhexanoate ($C_8H_{15}O_2Ag$) and inorganic salts. The ratio of the mixture is shown in Table 1. The materials of the metal flakes 12 are selected from the group consisting of Cu, Pt, Ni, Ag, and Au. The ratio of the metal flakes in the mixture is in a range of 60–80%. The ratio of the metal spheres relative to the metal flakes is in a range of approximately 30–60%.

TABLE 1

| $Ag_2C_2O_4$/ $C_8H_{15}O_2Ag$ metal precursor/ silver flake | 0% | 5% | 15% | 35% | 45% |
|---|---|---|---|---|---|
| conductivity of mixture of 20% $C_8H_{15}O_2Ag$ (μΩcm) | 8.15 | 6.5 | 9.3 | 8.2 | ☒ |
| conductivity of mixture of 30% $C_8H_{15}O_2Ag$ (μΩcm) | 16.3 | 11.2 | 18.6 | 15.8 | ☒ |
| conductivity of mixture of 40% $C_8H_{15}O_2Ag$ (μΩcm) | 21.2 | 16.9 | 24.2 | 21.3 | ☒ |
| curing temperature 15 sec (° C.) | 250 | 190 | 190 | 190 | 190 |

The preferable ratios of the mixture are shown in the gray area of the Table 1. When a mixture of 20% $C_8H_{15}O_2Ag$ and the ratios of $Ag_2C_2O_4$/$C_8H_{15}O_2Ag$ are in a range of 5% to 35% at 190° C. 15 sec, the conductivity of the metal layer has relatively low resistivity.

An embodiment of a method for forming a conductive layer on a substrate at relative low temperature is provided. A layer of metal paste is applied on the substrate. The metal paste comprises a plurality of metal flakes, a plurality of nanometer metal spheres, and a plurality of mixed metal precursors. The layer of metal composite is cured to induce an exothermic reaction, thereby forming a conductive layer on the substrate at a relatively low temperature. The inorganic salt comprises a silver oxalate ($Ag_2C_2O_4$). The organic acidic salt comprises a silver 2-ethylhexanoate ($C_8H_{15}O_2Ag$).

Figure 2:
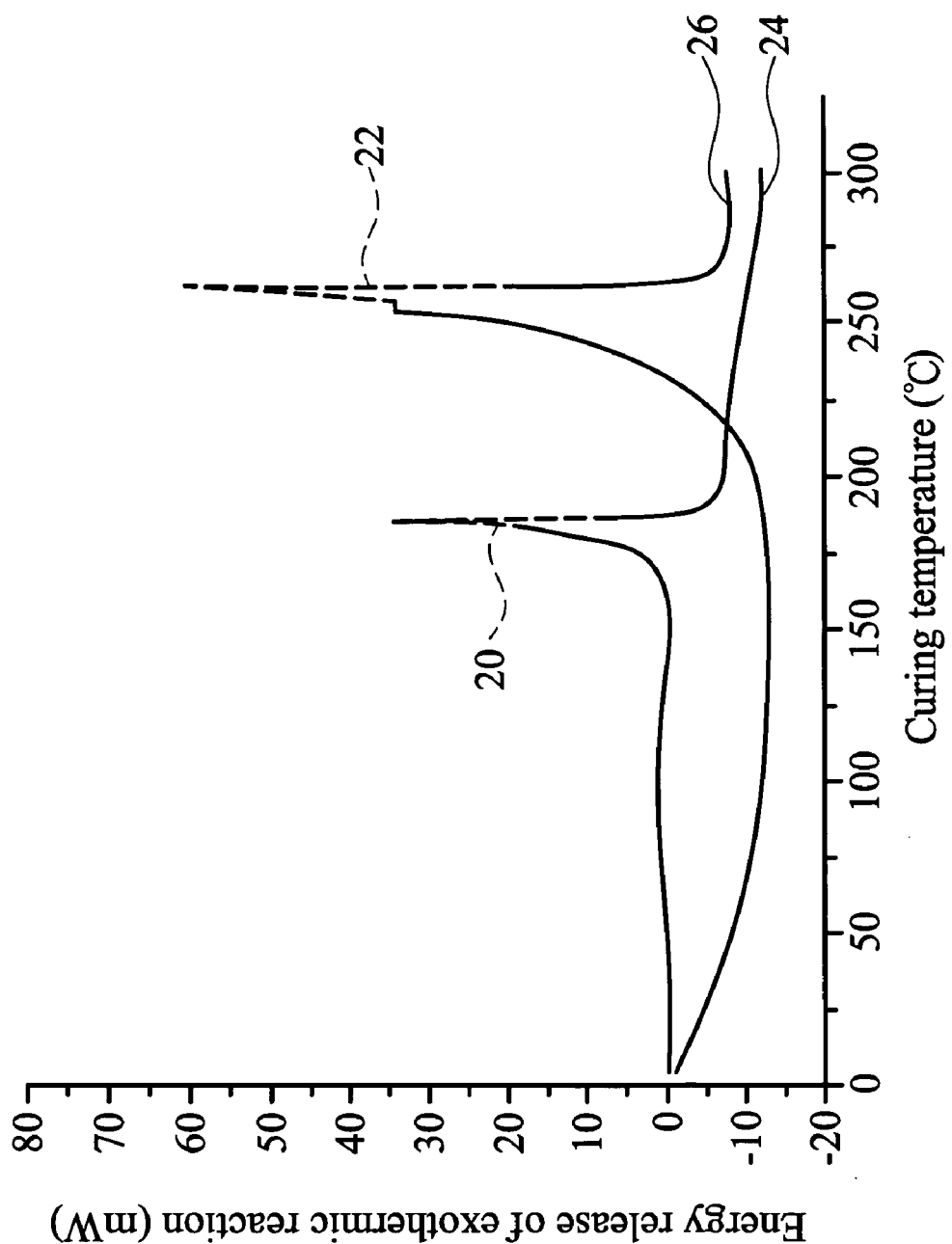
FIG. 2 is graph illustrating curves of curing temperature dependent of energy release of exothermic reaction.

FIG. 2 is graph illustrating curves of curing temperature dependent on the energy release of an exothermic reaction. In FIG. 2, curve 24 exerts exothermic effect 20 at 180° C., compared with conventional method curve 26 at 250° C. The reaction equations are:

$$Ag_2C_2O_4 \rightarrow 2Ag+2CO_2+\Delta H_1 \qquad \text{Eq. 1}$$

$$AgC_8H_{15}O_2+(43/4)O_2+\Delta H_2 \rightarrow Ag+8CO_2+(15/2)H_2O \qquad \text{Eq. 2}$$

In Eq. 1, $Ag_2C_2O_4$ is reduced into silver and $CO_2$, releasing heat $\Delta H_1$. In Eq. 2, $C_8H_{15}O_2Ag$ absorbs heat $\Delta H_1$ released from Eq. 1 and is reduced into silver, $CO_2$, and $H_2O$ at a temperature less than 200° C. The overall reaction is an exothermic reaction.

The decomposition temperature of the mixture of metal precursors is reduced from 250° C. to 180° C. by adding $Ag_2C_2O_4$ into $C_8H_{15}O_2Ag$. The heat released from reduction of $Ag_2C_2O_4$ can trigger decomposition of $C_8H_{15}O_2Ag$ at a temperature less than 200° C., thereby forming continuous silver layer with resistivity less than 7 μΩcm.

Conductive layers and fabrication methods thereof provide the following potential advantages. First, by mixing a plurality of different sizes of metal particles with a plurality of different sizes of metal flakes, the continuity of pure metal in the main layer can be improved. Second, using the mixture of the metal precursors, such as silver oxalate and long chain metal carboxyl compounds, can reduce decomposition at a temperature less than 200° C. Nanometric silver can be potentially reduced from the metal precursors, comprising excellent wieldability at relatively low temperature resulting in increasing the effective conductive traces of pure metal and the conductivity of metal film.

While the invention has been described by way of example and in terms of preferred embodiment, it is to be understood that the inventions is not limited to the disclosed embodiments. To the contrary, it is intended to cover various modifications and similar arrangements (as would be apparent to those skilled in the art). Thus, the scope of the appended claims should be accorded the broadest interpretations so as to encompass all such modifications and similar arrangements.

What is claimed is:

1. A method for forming a conductive layer on a substrate, comprising:
   applying a layer of a metal composite on the substrate; the metal composite comprising a plurality of metal flakes, a plurality of nanometric metal spheres, and a plurality of mixed metal precursors; and
   curing the layer of metal composite to induce an exothermic reaction, thereby forming a conductive layer on the substrate at a relatively low temperature,
   wherein the plurality of mixed metal precursors comprises a mixture of inorganic salts and organic acidic salts.

2. The method as claimed in claim 1, wherein the inorganic salt comprises a silver oxalate ($Ag_2C_2O_4$).

3. The method as claimed in claim 1, wherein the organic acid salt comprises a silver 2-ethylhexanoate ($C_8H_{15}O_2Ag$).

4. The method as claimed in claim 1, wherein the curing temperature is approximately less than 200° C.

5. A patterned conductive layer on a substrate, comprising:
   a substrate;
   a patterned metal layer formed on the substrate, wherein the metal layer is made by the method as claimed in claim 1.

* * * * *